United States Patent
Winer et al.

(10) Patent No.: US 10,830,810 B2
(45) Date of Patent: Nov. 10, 2020

(54) METHOD AND SYSTEM FOR DETECTING RESOLVER/SYNCHRO FAULTS

(71) Applicant: Hamilton Sundstrand Corporation, Charlotte, NC (US)

(72) Inventors: Gordon Elliott Winer, Phoenix, AZ (US); Shihab T. A. Muhammed, Kerala (IN); Shardul Shrinivas Bapat, Karnataka (IN)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 256 days.

(21) Appl. No.: 15/901,539

(22) Filed: Feb. 21, 2018

(65) Prior Publication Data
US 2019/0195941 A1    Jun. 27, 2019

(30) Foreign Application Priority Data

Dec. 27, 2017  (IN) .............................. 201711046887

(51) Int. Cl.
*G01R 31/28* (2006.01)
*G01D 5/244* (2006.01)
(Continued)

(52) U.S. Cl.
CPC ........... *G01R 31/2829* (2013.01); *G01D 3/08* (2013.01); *G01D 5/2291* (2013.01);
(Continued)

(58) Field of Classification Search
CPC ...... G01R 31/2829; G01R 31/06; G01D 3/08; G01D 5/2291; G01D 105/2448; G01D 105/2449; G01D 18/00
(Continued)

(56) References Cited

U.S. PATENT DOCUMENTS 5,777,468 A * 7/1998 Maher ................. G01D 5/2291
                                                          318/657
6,356,075 B1 * 3/2002 Shank ................ B60G 17/0185
                                                          280/5.501
(Continued)

FOREIGN PATENT DOCUMENTS

EP        3505872 A1 * 7/2019  ............... G01D 3/08
JP     2017044528 A  *  3/2017
JP     2017044528 A     3/2017

OTHER PUBLICATIONS

EPO translation of JP-2017-044528-A . (Year: 2019).*
European Search Report for Application No. 18215603A dated Apr. 29, 2019, 9 pages.

*Primary Examiner* — Patrick Assouad
*Assistant Examiner* — Sean Curtis
(74) *Attorney, Agent, or Firm* — Cantor Colburn LLP (57) ABSTRACT

Embodiments herein relate to a sensor fault measurement system. The system includes a sensor having a primary winding, a first secondary winding and a second secondary winding and a wiring harness operably connected to the primary winding, first secondary winding and second secondary winding of the sensor. The system also includes a controller operably connected to the wiring harness. The controller includes a bias network configured to apply a common mode DC voltage bias of opposite sign to the first sensor output and the second sensor output respectively, and a fault sense circuit configured to monitor the DC voltage bias on first sensor output and the DC voltage bias on second sensor output, and identify a sensor fault if at least one of the DC voltage bias on first sensor output and the DC voltage bias second sensor output is impacted beyond a selected threshold.

16 Claims, 4 Drawing Sheets

(51) Int. Cl.
    *G01D 5/22*     (2006.01)
    *G01D 18/00*     (2006.01)
    *G01D 3/08*     (2006.01)
    *G01R 31/72*     (2020.01)

(52) U.S. Cl.
    CPC ......... *G01D 5/2448* (2013.01); *G01D 5/2449* (2013.01); *G01D 18/00* (2013.01); *G01R 31/72* (2020.01)

(58) Field of Classification Search
    USPC .............................. 324/207.23–207.24, 750.3
    See application file for complete search history.

(56) References Cited

U.S. PATENT DOCUMENTS

| | | | |
|---|---|---|---|
| 6,822,882 B1 * | 11/2004 | Jacobs | H03K 17/163 363/21.06 |
| 7,834,576 B2 * | 11/2010 | Fu | G01D 18/00 318/661 |
| 7,863,850 B2 * | 1/2011 | Fu | G03B 27/42 318/605 |
| 8,264,315 B2 * | 9/2012 | Fox | H01F 21/06 336/130 |
| 8,467,157 B2 * | 6/2013 | Gaknoki | H02H 7/1255 361/18 |
| 8,513,964 B2 * | 8/2013 | Yue | H02H 3/335 324/750.3 |
| 9,297,672 B2 * | 3/2016 | Kim | G01D 5/24457 |
| 9,448,275 B2 * | 9/2016 | Wingerter | G01D 5/12 |
| 10,050,533 B2 * | 8/2018 | Jacobson | H02M 3/24 |
| 10,075,081 B2 * | 9/2018 | Kikuchi | H02M 3/33592 |
| 10,345,357 B2 * | 7/2019 | Wingerter | G01R 19/175 |
| 2008/0278106 A1 * | 11/2008 | Fu | G01D 18/00 318/661 |
| 2008/0284366 A1 * | 11/2008 | Fu | G01D 18/00 318/661 |
| 2012/0013345 A1 * | 1/2012 | Carter | G01D 3/08 324/538 |
| 2012/0032768 A1 * | 2/2012 | Fox | G01D 5/2291 336/220 |
| 2013/0027815 A1 * | 1/2013 | Gaknoki | H02M 3/33569 361/18 |
| 2014/0375331 A1 * | 12/2014 | Wingerter | G01R 31/282 324/537 |
| 2015/0077156 A1 * | 3/2015 | Kim | G01D 5/24457 324/765.01 |
| 2016/0261204 A1 * | 9/2016 | Kikuchi | H02M 3/33592 |
| 2017/0248648 A1 * | 8/2017 | Wingerter | G01D 5/24457 |
| 2018/0034372 A1 * | 2/2018 | Jacobson | H01F 27/36 |
| 2018/0038714 A1 * | 2/2018 | Sloat | G01D 5/2291 |
| 2018/0292444 A1 * | 10/2018 | Hess | G01D 5/24457 |
| 2019/0195941 A1 * | 6/2019 | Winer | G01D 5/2449 |

\* cited by examiner

METHOD AND SYSTEM FOR DETECTING RESOLVER/SYNCHRO FAULTS

CROSS-REFERENCE TO RELATED APPLICATIONS

This application claims the benefit of IN Application No. 201711046887 filed Dec. 27, 2017, which is incorporated herein by reference in its entirety.

TECHNICAL FIELD

The present disclosure relates to a monitoring method and system for resolver, synchro, rotating transformers sensors and to a corresponding method for monitoring resolver short circuits and open circuits, particularly m an aircraft application.

BACKGROUND

Modern aircraft have a plurality of control surfaces, which are commonly controlled by electric or hydraulic actuators, particularly in fly-by-wire aircraft. This means that the pilot does not receive any direct feedback relating to the movements of the control surfaces, e.g., via control cables on the control stick. In order to be able to monitor the movement of the control surfaces, sensors are therefore used on the individual control surfaces to detect the position of the respective control surface. The values detected by the sensors for the positions of the control surfaces can subsequently be compared with the commanded values, and a malfunction of a control surface can be identified in the event of a deviation of the positions detected by the respective sensor from the commanded values.

A variety of sensors may be employed depending on the application. The synchros and resolvers are sensors that are robust and have enjoyed a long history of use in aircraft applications. Rotary or Linear Variable Differential Transformer sensors (RVDT or LVDT sensors) are also conventionally used as sensors in aircraft because these sensors are very robust with respect to external disturbances and have a very simple construction. Synchros, resolvers, RVDT, RVT (Rotary Variable Transformer), or LVDT are all electromechanical sensing transducers that are intended to sense precise mechanical rotational or linear motion. These devices all contain a single primary winding coupled to one or more (three in the case of a synchro) secondary windings, via a movable core. The core is mechanically connected to a linear shaft for LVDTs and to a rotary shaft for resolvers, RVDTs, and RVTs. For RVDTs and RVTs, the voltage coupled to the secondary winding(s) is linearly proportional to the shaft displacement or rotor angle. However, for resolvers and synchros the outputs are not linear to shaft displacement angle but are related by mathematical/trigonometric relationships. For resolvers, the relationship is based on the SIN and COS θ of the displacement angle, while for synchros, the relationship is based on the SIN of the displacement angle with phase angle shifts.

Synchros, resolvers, and RVDTs/LVDTs have two or three secondary windings, while RVT's have only one secondary winding. Synchros, resolvers, RVDTs and LVDTs have outputs that are more immune to primary excitation level and frequency variations because the outputs are differentially measured or mathematically related. On the other hand, RVTs have secondary outputs that are ratiometric to the primary excitation voltage, so a more precise primary excitation level is typically employed. Because of the extra secondary winding, resolvers, synchros, RVDTs/LVDTs require more aircraft wiring and sensing circuitry. Advantageously, resolvers and synchros can operate over all 4 quadrants of angle, ranging from 0 to 360 degrees, whereas RVDTs and RVTs are limited to about 90 degrees of range. Synchros and resolvers typically employ phase sensitive or synchronous demodulation to operate over multiple quadrants, so detection circuits are more complex but more robust. While interfaces to RVDTs, LVDTs, synchros, and resolvers all require relatively complex interfaces for excitation and sensing to ensure their robustness, in some applications, even these interfaces may be subject to faults.

When sensors are used to detect the movement of the individual control surfaces, the sensors used must typically be monitored to ensure error free operation. Failures of sensors, and/or the wiring harness, or interfaces to sensors, impact system reliability and result in a need for redundancy and overdesign to ensure operation. It is also desirable to ensure that potential failures are not only detectable, but also preferably relegated to lesser importance and to minimize impact on system reliability. Therefore, it is desirable to have a simplified sensor interface where potential failures are not just detectable, but actually mitigated such that their impact is not significant.

BRIEF DESCRIPTION

Embodiments herein relate to a sensor fault detection system. The system includes a sensor having a primary winding, a first secondary winding and a second secondary winding and a wiring harness operably connected to the primary winding, first secondary winding and second secondary winding of the sensor. The system also includes a controller operably connected to the wiring harness. The controller includes a bias network configured to apply a common mode DC voltage bias of opposite polarity to the first sensor output and the second sensor output respectively and a fault sense circuit configured to monitor the DC voltage bias on first sensor output and the DC voltage bias on the second sensor output, and identify a sensor fault if at least one of the DC voltage bias on first sensor output and the DC voltage bias on the second sensor output is impacted beyond a selected threshold.

In addition to one or more of the features described above, or as an alternative, further embodiments may include that the controller can identify at least one of: a short circuit to common of the primary winding or a portion of the wiring harness connected to it; a short circuit to common of the first secondary winding or a portion the wiring harness connected to it; or a short circuit to common of the second secondary winding or a portion of the wiring harness connected to it.

In addition to one or more of the features described above, or as an alternative, further embodiments may include that the controller can identify at least one of: short circuit between at least one of the primary winding or a portion of the wiring harness connected to it, the first secondary winding or a portion of the wiring harness connected to it, and the second secondary winding or a portion of the wiring harness connected to it.

In addition to one or more of the features described above, or as an alternative, further embodiments may include that the controller can identify at least one of: an open circuit of the primary winding or a portion of the wiring harness connected to it; an open circuit of first secondary winding or a portion of the wiring harness connected to it; and an open circuit of the second secondary winding a portion of the wiring harness connected to it.

In addition to one or more of the features described above, or as an alternative, further embodiments may include that the controller is also configured to execute a built in test function.

In addition to one or more of the features described above, or as an alternative, further embodiments may include that the built in test function includes the controller executing a error checking based on at least one mathematical relationship associated with the sensor.

In addition to one or more of the features described above, or as an alternative, further embodiments may include that the built in test function includes the controller applying the primary excitation as well as a known stimulus as to the sensor and monitoring a response.

In addition to one or more of the features described above, or as an alternative, further embodiments may include that the built in test function includes at least one of detecting at least one of: a short circuit to common, wherein the short circuit is between: the primary winding or a portion of the wiring harness connected to it; the first secondary winding or a portion of the wiring harness connected to it; and the second secondary winding or a portion of the wiring harness connected to it; a short circuit, between at least two of: the primary winding or a portion of the wiring harness connected to it; the first secondary winding or a portion of the wiring harness connected to it; and the second secondary winding or a portion of the wiring harness connected to it; and an open circuit of at least one of: the primary winding or a portion of the wiring harness connected to it; the first secondary winding or a portion of the wiring harness connected to it; and the second secondary winding a portion of the wiring harness connected to it.

In addition to one or more of the features described above, or as an alternative, further embodiments may include a third secondary winding on the sensor operably connected to the controller by the wiring harness, wherein the controller is configured to detect at least one of: a short circuit to common of the third secondary winding or a portion of the wiring harness connected to it; a short circuit, wherein the short circuit is between at least two of: the primary winding or a portion of the wiring harness connected to it; the first secondary winding or a portion of the wiring harness connected to it; the second secondary winding or a portion of the wiring harness connected to it; and the third secondary winding or the portion of the wiring harness connected to it; and an open circuit of the third secondary winding or the portion of the wiring harness connected to it.

In addition to one or more of the features described above, or as an alternative, further embodiments may include that the sensor includes at least one of a resolver, synchro, RVDT, LVDT, and RVT.

Also described herein in an embodiment is a method of sensor fault measurement and detection in a sensor system with a sensor having a primary winding and at least a first secondary winding providing a first sensor output and a second secondary winding providing a second sensor output, each operably connected via a wiring harness to a controller. The controller is configured to apply a common mode DC voltage bias of opposite sign to the first sensor output and the second sensor output respectively monitor the DC voltage bias on first sensor output and the DC voltage bias second sensor output, and identify a sensor fault if at least one of the DC voltage bias on first sensor output and the DC voltage bias second sensor output is impacted beyond a selected threshold.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The foregoing and other features, and advantages of the embodiments are apparent from the following detailed description taken in conjunction with the accompanying drawings in which.

DETAILED DESCRIPTION

In general, embodiments herein relate generally to a sensor interface design where selected faults are detected such that they minimize impact on system operation and overall reliability. In particular detection of short and open circuits in sensors in an aircraft. The described embodiments permit readily detecting such faults without impacting normal measurement and detection. In operation, a common mode DC bias is added to a sensor signal that facilitates detection and quantification of faults. In some embodiments more than one common mode DC bias is employed.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended. The following description is merely illustrative in nature and is not intended to limit the present disclosure, its application or uses. It should be understood that throughout the drawings, corresponding reference numerals indicate like or corresponding parts and features. As used herein, the term controller refers to processing circuitry that may include an application specific integrated circuit (ASIC), an electronic circuit, an electronic processor (shared, dedicated, or group) and memory that executes one or more software or firmware programs, a combinational logic circuit, and/or other suitable interfaces and components that provide the described functionality.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The term "a plurality" is understood to include any integer number greater than or equal to two, i.e. two, three, four, five, etc. The term "connection" can include an indirect "connection" and a direct "connection".

As shown and described herein, various features of the disclosure will be presented. Various embodiments may have the same or similar features and thus the same or similar features may be labeled with the same reference numeral, but preceded by a different first number indicating the figure to which the feature is shown. Thus, for example, element "a" that is shown in Figure X may be labeled "Xa" and a similar feature in Figure Z may be labeled "Za." Although similar reference numbers may be used in a generic sense, various embodiments will be described and various features may include changes, alterations, modifications, etc. as will be appreciated by those of skill in the art, whether explicitly described or otherwise would be appreciated by those of skill in the art.

Figure 1:
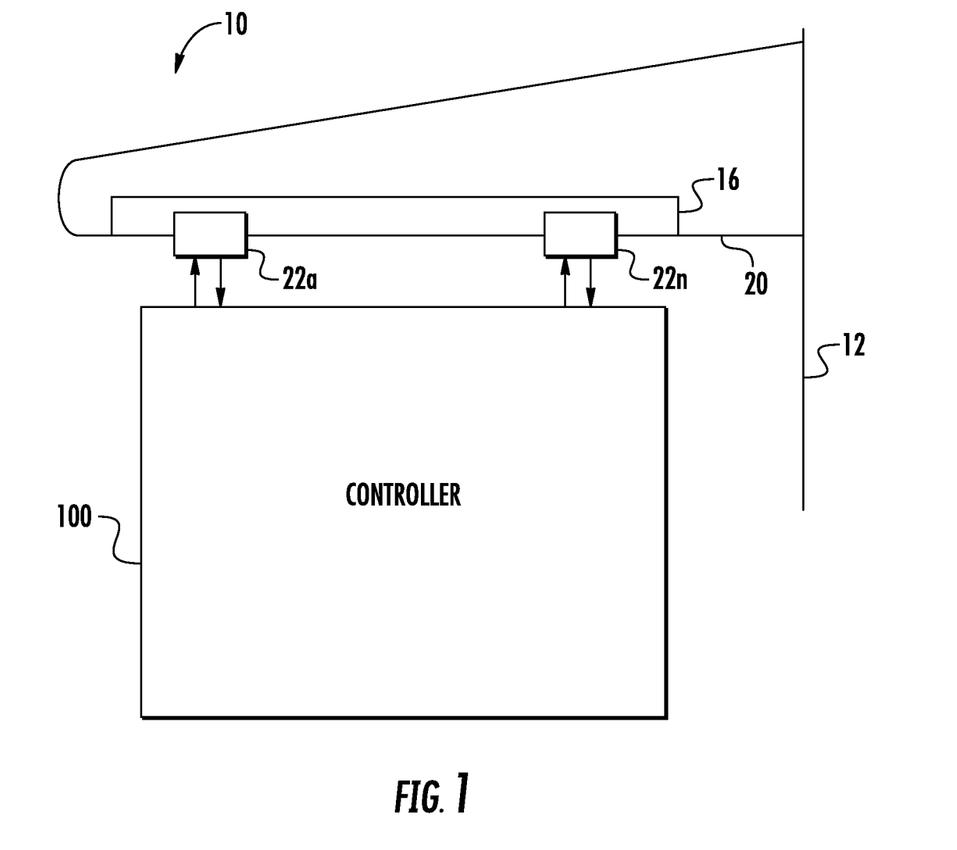
FIG. 1 depicts a simplified diagram of an aircraft data acquisition or control system in accordance with an embodiment.

In general, embodiments herein relate generally to a sensor interface design where risk of selected faults are mitigated such that they do not impact system operation and overall reliability. Turning now to FIG. 1, a simplified diagram of a control system 10 in an aircraft 12 is depicted. The control system 10 is used to control the position of a control surface 16 depicted in this instance, on an aircraft wing 20. The control system 10 includes one or more sensors 22a, 22b . . . 22n configured to measure an aircraft parameter. For example, in this instance, a displacement of the control surface 16. The sensor could be any configured to measure the displacement of the control surface 16 or an actuator and the like including, but not limited to synchros, resolvers, RVDTs/LVDTs, RVTs, and the like. Such sensors 22a, 22b . . . 22n generally employ a single primary winding 26 (FIG. 2) and two or more secondary windings 27a, 27b (FIG. 2), and are all relevant to the embodiments described herein. While the following descriptions of the embodiments will be made with respect to application with a resolver sensor, it will be appreciated that the described embodiments may readily be applied to synchros as well as RVDTs, and LVDTs.

Figure 2:
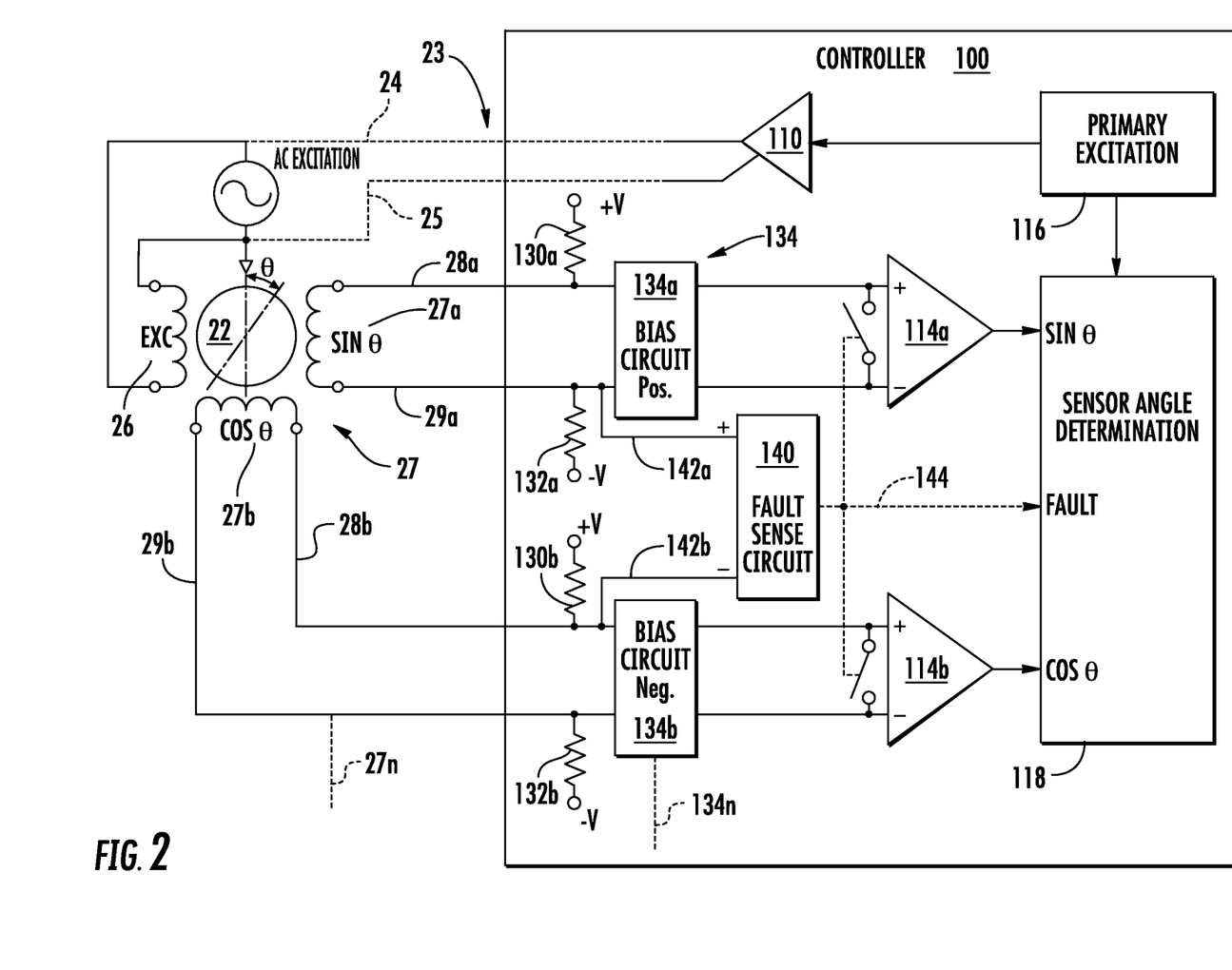
FIG. 2 depicts a simplified diagram of a controller and sensor interfaces in accordance with an embodiment.

Referring now to FIG. 2 in combination with FIG. 1, when a sensor 22 is employed in a measurement application, a controller or data acquisition system 100, hereinafter just referred to as controller 100 optionally provides a precise alternating current (AC) excitation 116 via source 110 and a wiring harness shown generally as 23. The excitation is transmitted via the wiring harness 23 on lines 24 and 25, respectively, to the primary 26 of the sensor 22 (in this instance a resolver). In some embodiments the excitation 116 may be provided independent from the controller 100 and may be measured by the controller 100. Advantageously, as is conventionally understood with resolvers, because the secondary winding 27a, 27b output voltages are compared to one another in a ratiometric comparison, the shaft angle determination is substantially independent of variations in the excitation voltage 116 as applied to the primary winding 26 of the sensor 22. The controller 100 also precisely reads the AC output voltage level of each resolver secondary winding 27a, 27b denoted SIN θ and COS θ respectively. The secondary windings 27a, 27b are connected to the controller 100 via lines 28a, 29a and 28b, 29b of the wiring harness 23, respectively. The AC output voltage level of each resolver secondary winding 27a, 27b is applied to a differential amplifier 114a, 114b in the controller 100 for further processing and the shaft angle determination for the sensor 22. For these systems, it is commonly desirable to try to detect any functional failures of the sensor 22 and any associated wiring harness 23. Such potential failures include a variety of failure modes such as open circuits and short circuits of the sensor windings and open circuits and short circuits of any associated wiring, e.g., windings 26, 27a, 27b or lines 24, 25, or 28a, 28b and 29a, 29b.

Advantageously, many of these potential faults exhibit relatively straight forward symptoms and facilitate readily available methods of detection. However, an aircraft wiring short circuit of the sensor primary line 24 and return line 25 to the aircraft structure to the controller circuit voltage reference (local ground) or to the secondary windings 27a, 27b can prove difficult to detect and/or mitigate. Some failures can be particularly difficult to detect because conventionally the short or open circuit voltage values may be within the normal voltage operating range for the sensor 22. For example, errors based on short to a ground or winding to winding short near the location of the sensor 22 (on a wing 20) may be difficult to detect because the short at the wing 20 may not be at the same DC or AC potential of the common aircraft circuit voltage reference (local ground, hereinafter referred to as common) point within the controller 100, which may be located in an avionics bay in the aircraft 12 and may or may not be isolated from aircraft chassis ground. For example, in some embodiments, the controller measurements for the sensor 22 may be isolated from ground whether local common to the controller or at the sensor 22. The difference voltage between the two ground points under such a fault condition, appears at the controller 100 as an in-range, normal sensor voltage. For typical aircraft systems, voltage differentials between aircraft ground points can be as high as one volt or more due to the large distances between locations of sensors 22 and the controller 100 in a data acquisition/control system 10. As a result, it is advantageous to be able to isolate and detect such faults and to be immune to such aircraft ground differentials as may be introduced by a various types of faults associated with a sensor 22.

It will be appreciated that while the embodiments herein have been described with respect to detecting/mitigating certain described failures for the primary winding 26 and primary source wiring 24, return line 25, and or secondary windings 27a, 27b and their respective wiring, detection of other potential failure modes is also possible. For example, during power on or initiated built in test (PBIT, IBIT), when the sensor 22 is not being used, the external wiring short may optionally be detected by applying known stimulus to the sensor 22-primary winding high side on line 24 and monitoring the voltage developed by the secondary windings 27a, 27b for the expected response. Moreover, during PBIT or IBIT, test voltages and currents may be applied to the sensors 22 to ensure no other failures are detected. For example, during PBIT or IBIT, fault modes that may be detected by conventional BIT methods include, but may not be limited to: an open primary winding 26 or primary excitation wire 24 (25); an open in the secondary winding 27a, 27b or secondary wire 28a, 29a, 28b, 29b; a shorted primary winding 26 or primary source wire on line 24 shorted to primary return wire 25; and a shorted secondary winding 27a, 27b or secondary output wire 28a, 28b, shorted to secondary return wire 29a, 29b.

Continuing with FIG. 2, in an embodiment, the controller 100 includes positive pull up impedances 130a and 130b connected between a positive voltage supply denoted +V and lines 28a and 28b respectively, as well as a negative pull down impedance 132a and 132b to a negative voltage supply denoted −V and lines 29a and 29b respectively. The pull up impedances 130a, 130b and pull down impedances 132a, 132b are applied to each of SIN θ and COS θ controller inputs for each resolver secondary winding 27a, 27b respectively. The secondary windings 27a, 27b are connected to the controller 100 via lines 28a, 29a and 28b, 29b of the wiring harness 23 respectively. Likewise, each of the SIN θ and COS θ controller inputs for each resolver secondary winding 27a, 27b also include a DC voltage bias network 134a and 134b. In an embodiment, the DC voltage bias network 134a provides a positive DC voltage bias to the SIN θ input on the controller 100 and amplifier 114a, while the DC voltage bias network 134b provides a negative DC voltage bias to the COS θ input on the controller 100 and amplifier 114b. In an embodiment, the DC voltage bias networks 134a, 134b are configured to provide a common mode DC bias voltage on each of the controller inputs for the SIN θ and COS θ outputs 27a and 27b of the sensor 22, i.e. on lines 28a, 29a and 28b, 29b of the wiring harness 23 respectively. Advantageously the DC voltage bias network(s) 134a, 134b are configured to provide substantially equal and opposite polarity biases to the SIN θ and COS θ outputs 27a and 27b of the sensor 22. In operation, the bias networks 134a, 134b need only provide sufficient DC bias to maintain the fault circuit 140 disabled as will be discussed at a later point herein. While a particular operation of the DC voltage bias network 134a, 134b is described, it will be appreciated that such a configuration is merely illustrative. Other configurations and implementations are possible and envisioned.

The controller 100 also includes a fault sense circuit or function 140. The fault sense circuit 140 includes, but is not limited to, two input lines 142a, 142b and a fault command output 144. In an embodiment, the fault input lines 142a, 142b include a positive fault input line 142a connected to one side of the SIN θ winding 27a sensor output on line 29a. Likewise, the fault input lines 142a, 142b also include a negative fault input 142b connected to one side of the COS θ winding 27b sensor output on line 28b. In an embodiment, the DC bias circuits 134a and 134b are configured to maintain a positive DC voltage bias on line 29a and a negative DC bias voltage on line 28b, respectively. As long as both conditions are satisfied, no fault is detected. In other words, if either the positive DC voltage bias on line 29a, or negative DC voltage bias on line 28b, falls below a selected threshold, then the fault command is activated. In an embodiment, the fault command output 144 when activated causes the inputs of the differential amplifier 114a associated with the SIN θ input and differential amplifier 114b associated with the COS θ input to be shunted. The zero voltage input on both the SIN θ and COS θ input causes conventional Sine and Cosine processing and fault determinations to indicate the fault. For example, employing, conventional $Sin^2 \theta + Cos^2 \theta = 1$ identity.

Continuing now with FIG. 2, for further detail on the function and operation of the process for detection of faults of the sensor 22. In an embodiment, under normal operation, as the sensor 22 operates, the bias circuits 134a, 134b cause a DC voltage bias to be added to the SIN θ and COS θ outputs 27a, 27b of the sensor 22 such that the bias is common mode and the AC measurement of the signals at the differential amplifiers 114a, 114b is unaffected. The sensor output signals 27a, 27b, SIN θ and COS θ are measured and processed in the sensor angle determination block 118 using conventional techniques. As stated earlier, conventional mathematical error checking is also employed. When a fault occurs at the sensor 22 or in the wiring harness 23, for example a short circuit to common or (other low impedance drain) on the low side of the SIN θ sensor output 27a or on line 29a of the wiring harness 23, the DC bias added to lines 28a and 29a is impacted and reduced to around 0 VDC. This reduction is detected by the fault sense circuit 140 on line 142a and causes the fault sense circuit 140 to command a sensor fault on line 144 shunting both inputs to the amplifiers 114a, and 114b. The shunted inputs cause the sensor angle determination block to detect zero volts on both the SIN θ and COS θ inputs (27a, 27b) and thus signal the fault. It will be appreciated that alternatively, the line 144 could also be measured to signal the fault directly, without the need to shunt the SIN θ and COS θ inputs at the differential amplifiers 114a and 114b.

As a second example of detecting a fault, an open circuit for example, on the high side of the SIN θ sensor output 27a or on line 28a of the wiring harness 23, the DC bias added to lines 28a and/or 29a is impacted and reduced to around 0V (or any voltage sufficient to cause the fault notification to be triggered) by the pull down resistor 132a eliminating the positive bias on line 29a (or likewise the negative bias on line 28b). Once again, this reduction is detected by the fault sense circuit 140 on line 142a and causes the fault sense circuit 140 to command a sensor fault on line 144 shunting both inputs to the amplifiers 114a, and 114b. The shunted inputs cause the sensor angle determination block 118 to detect zero volts on both the SIN θ and COS θ inputs at amplifiers 114a, 114b and thus, signal the fault.

Figure 3:
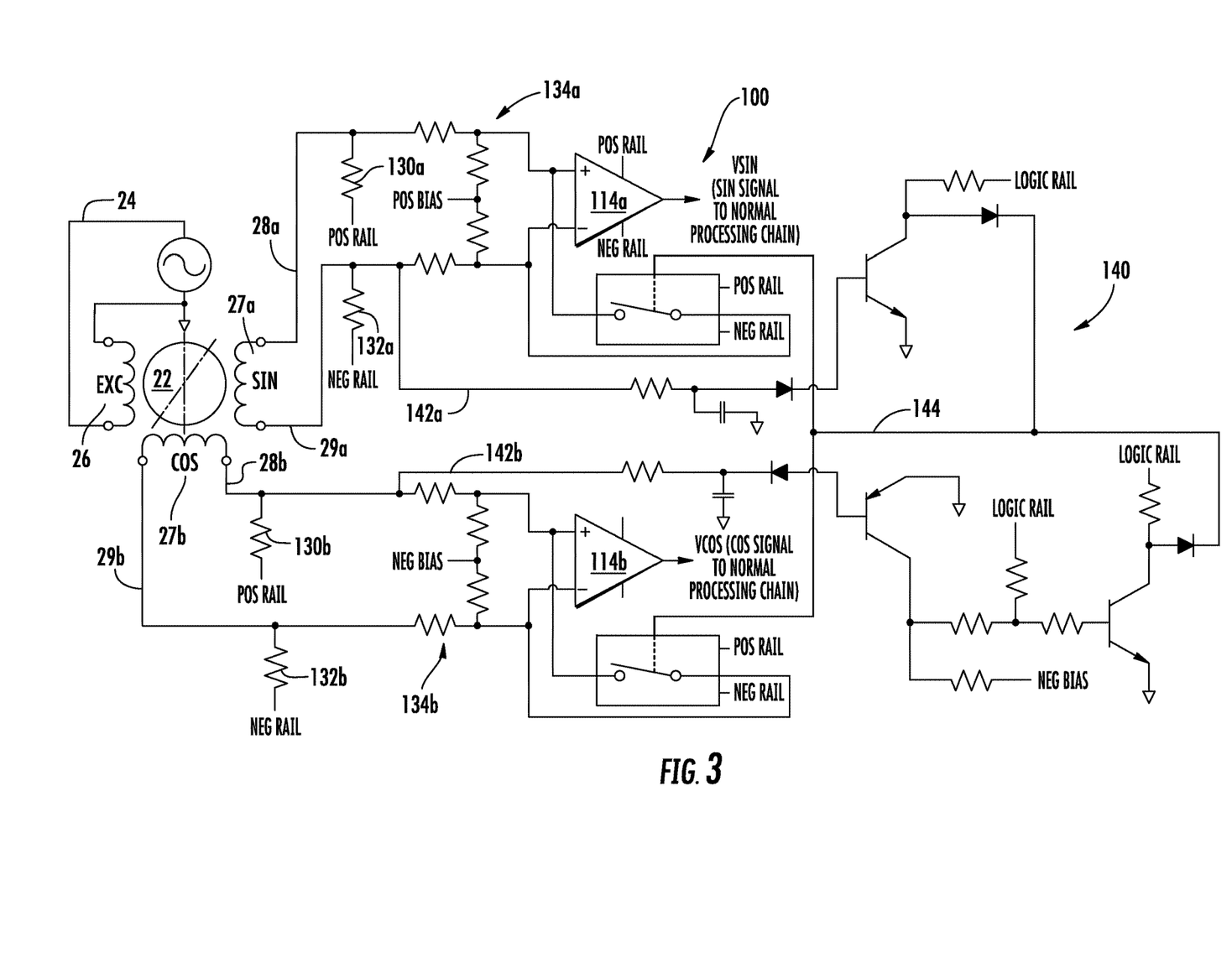
FIG. 3 depicts a simplified schematic of a controller and sensor interfaces in accordance with an embodiment.

It will be appreciated that is this way, via interaction between the pull up resistances 130a, 130b, pull down resistances 132a, 132b, and the bias circuits 134a, 134b, for selected faults at the sensor 22 at the outputs 27a, 27b or of the lines 28a, 29a, 28b, 29b of the wiring harness 23, the bias applied to the fault sense circuit 140 at lines 142a, 142b is impacted. This impact is detected and the fault detected. Advantageously, this approach provides a unique means of detecting faults in the resolver sensor 22 that is independent of sensor rotary position. FIG. 3 provides an example implementation of a sensor fault detection system and function in controller 100.

It will further be appreciated that while the embodiments herein are described with reference to the sensor 22 being a resolver, such description is merely for illustration. One skilled in the art would appreciate that the described embodiments may readily be applied to a synchro as well as other sensor types as identified herein without deviating from the scope and breadth of the claims. For example, in the case of a synchro, synchros employ a third or more secondary winding(s) 27n, an additional bias circuit(s) 134n could be employed and configured such that the fault sense circuit 140 could detect certain faults associated with the third (and subsequent) winding(s) 27n. In such a configuration, because synchro outputs exhibit different mathematical relationships than a resolver, the controller 100 would employ different relationships for error checking and determination associated with the mathematical relationships between the synchro outputs.

Figure 4:
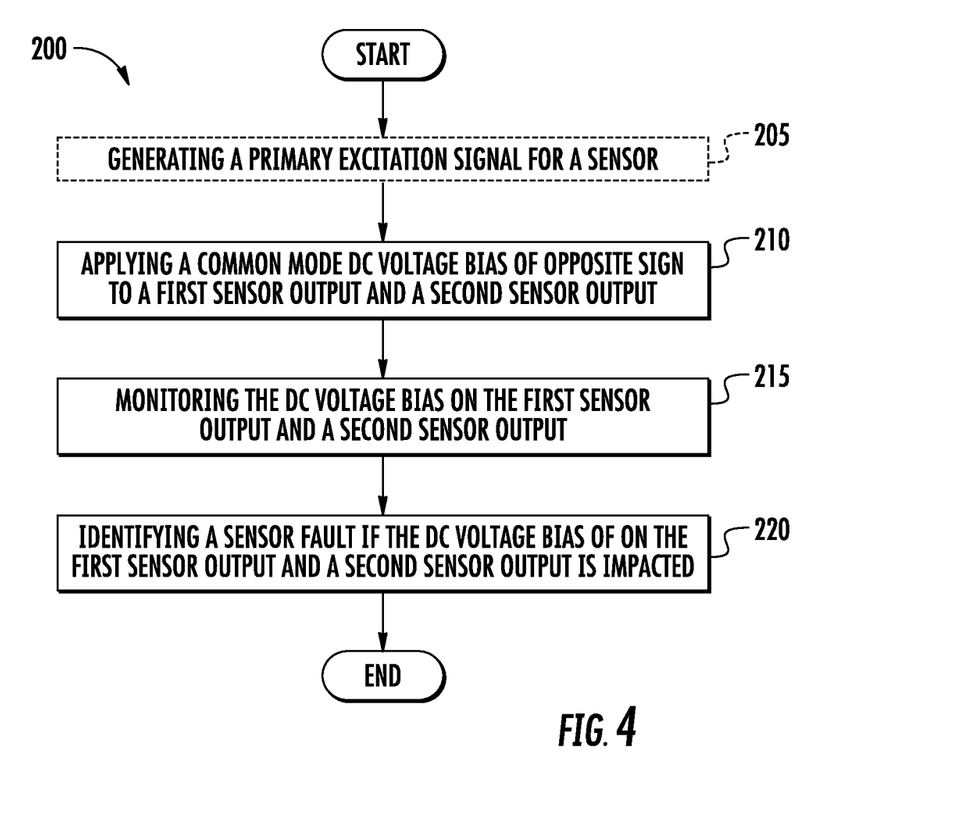
FIG. 4 is a flow chart depicting a method of fault tolerant sensor interface in accordance with an embodiment.

Turning now to FIG. 4, a flowchart of the method 200 of detecting and mitigating sensor faults is depicted. The method includes an optional process step 205 of generating at the controller 100 a primary excitation signal 116 for a sensor 22 and transmitting it to the sensor 22 on lines 24 and 25 respectively. At process step 210 a common mode DC voltage of opposite sign is applied to a first sensor output 27a and a second sensor output 27b. At process step 215, the DC voltage bias on the first sensor output 27a and the second sensor output 27b is monitored and measured. Based on the, measured bias voltages and mathematical checks of the sensor voltages the process can identify a fault based on the voltages and their relationships as depicted at process step 220.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the disclosure has been provided in detail in connection with only a limited number of embodiments, it should be readily understood that the present disclosure is not limited to such disclosed embodiments. Rather, embodiments can be modified to incorporate any, number of variations, alterations, substitutions, combination, sub-combination, or equivalent arrangements not heretofore described, but which are commensurate with the spirit and scope of the disclosure. Additionally, while various embodiments have been described, it is to be understood that aspects of the disclosure may include only some of the described embodiments. Accordingly, embodiments are not to be seen as limited by the foregoing description, but only limited by the scope of the appended claims.

What is claimed is:

1. A sensor fault detection system comprising:
    a sensor having a primary winding
    a first secondary winding providing a first sensor output and a second secondary winding providing a second sensor output;
    a wiring harness operably connected to the primary winding, the first secondary winding and the second secondary winding of the sensor;
    a controller operably connected to the wiring harness, the controller including:
        a bias network configured to apply a first DC voltage bias to the first sensor output and a second DC voltage bias of opposite polarity to the second sensor output respectively;
        a fault sense circuit configured to monitor the first DC voltage bias on the first sensor output and the second DC voltage bias on the second sensor output, and identify a sensor fault if at least one of the DC voltage bias on the first sensor output and the second DC voltage bias of the second sensor output is impacted beyond a selected threshold; and
    a third secondary winding on the sensor operably connected to the controller by the wiring harness, wherein the controller is configured to detect at least one of:
        a short circuit to common of the third secondary winding or a portion of the wiring harness connected to it;
        a short circuit, wherein the short circuit is between at least two of: the primary winding or a portion of the wiring harness connected to it; the first secondary winding or a portion of the wiring harness connected to it; the second secondary winding or a portion of the wiring harness connected to it; and the third secondary winding or the portion of the wiring harness connected to it; and
        an open circuit of the third secondary winding or the portion of the wiring harness connected to it.

2. The sensor fault detection system of claim 1, wherein the controller can identify at least one of:
    a short circuit to common of the primary winding or a portion of the wiring harness connected to it;
    a short circuit to common of the first secondary winding or a portion of the wiring harness connected to it; or
    a short circuit to common of the second secondary winding or a portion of the wiring harness connected to it.

3. The sensor fault detection system of claim 1, wherein the controller can identify at least one of:
    short circuit between at least one of the primary winding or a portion of the wiring harness connected to it, the first secondary winding or a portion of the wiring harness connected to it, and the second secondary winding or a portion of the wiring harness connected to it.

4. The sensor fault detection system of claim 1, wherein the controller can identify at least one of:
    an open circuit of the primary winding or a portion of the wiring harness connected to it;
    an open circuit of the first secondary winding or a portion of the wiring harness connected to it; and
    an open circuit of the second secondary winding or a portion of the wiring harness connected to it.

5. The sensor fault detection system of claim 1, wherein the controller is also configured to execute a built in test function.

6. The sensor fault detection system of claim 5, wherein the built in test function includes the controller applying a known stimulus as the primary excitation to the sensor and monitoring a response.

7. The sensor fault detection system of claim 5, wherein the built in test function includes at least one of detecting at least one of:
    a short circuit to common, wherein the short circuit is between: the primary winding or a portion of the wiring harness connected to it; the first secondary winding or a portion of the wiring harness connected to it; and the second secondary winding or a portion of the wiring harness connected to it;
    a short circuit, between at least two of: the primary winding or a portion of the wiring harness connected to it; the first secondary winding or a portion of the wiring harness connected to it; and the second secondary winding or a portion of the wiring harness connected to it; and
    an open circuit of at least one of: the primary winding or a portion of the wiring harness connected to it; the first secondary winding or a portion of the wiring harness connected to it; and
    the second secondary winding or a portion of the wiring harness connected to it.

8. A method of sensor fault detection in a sensor system with a sensor having a primary winding and at least a first secondary winding providing a first sensor output and a second secondary winding providing a second sensor output, each operably connected via a wiring harness to a controller, the method comprising:
    applying a common mode DC voltage bias of opposite sign to the first sensor output and the second sensor output respectively;
    monitoring the DC voltage bias on the first sensor output and the DC voltage bias second sensor output;
    identifying a sensor fault if at least one of the DC voltage bias on the first sensor output and the DC voltage bias on the second sensor output is impacted beyond a selected threshold; and
    detecting
        a short circuit to common of a third secondary winding or a portion of the wiring harness connected to the third secondary winding.

9. The sensor fault detection method of claim 8, wherein the method includes identifying at least one of:
    a short circuit to common of the primary winding or a portion of the wiring harness connected to it;
    a short circuit to common of the first secondary winding or a portion of the wiring harness connected to it; and a short circuit to common of the second secondary winding or a portion of the wiring harness connected to it.

10. The sensor fault detection method of claim 8, wherein the method includes identifying at least one of:
- a short circuit between at least one of the primary winding or a portion of the wiring harness connected to it; and
- a short circuit between the first secondary winding or a portion of the wiring harness connected to it, and the second secondary winding or a portion of the wiring harness connected to it.

11. The sensor fault detection method of claim 8, wherein the method includes identifying at least one of:
- an open circuit of the primary winding or a portion of the wiring harness connected to it;
- an open circuit of the first secondary winding or a portion of the wiring harness connected to it; and
- an open circuit of the second secondary winding or a portion of the wiring harness connected to it.

12. The sensor fault detection method of claim 8, further comprising executing a built in test function.

13. The sensor fault detection method of claim 12, wherein the built in test function includes executing error checking based on at least one mathematical relationship associated with the sensor.

14. The sensor fault detection method of claim 12, wherein the built in test function includes applying a known stimulus as the primary excitation to the sensor and monitoring a response.

15. The sensor fault detection method of claim 12, wherein the built in test function includes detecting at least one of:
- a short circuit to common of:
  - the primary winding or a portion of the wiring harness connected to it;
  - the first secondary winding or a portion of the wiring harness connected to it;
  - the second secondary winding or a portion of the wiring harness connected to it;
- a short circuit between at least one of:
  - the primary winding or a portion of the wiring harness connected to it;
  - the first secondary winding or a portion of the wiring harness connected to it; and
  - the second secondary winding or a portion of the wiring harness connected to it; and
- an open circuit of:
  - the primary winding or a portion of the wiring harness connected to it;
  - the first secondary winding or a portion of the wiring harness connected to it; and
  - an open circuit of the second secondary winding or a portion of the wiring harness connected to it.

16. The sensor fault detection method of claim 8, wherein the sensor includes at least one of a resolver, synchro, RVDT, LVDT, and RVT.

* * * * *